(12) United States Patent
Fu

(10) Patent No.: US 9,678,372 B2
(45) Date of Patent: Jun. 13, 2017

(54) PERIPHERAL TEST CIRCUIT OF DISPLAY ARRAY SUBSTRATE AND LIQUID CRYSTAL DISPLAY PANEL

(71) Applicant: SHENZHEN CHINA STAR OPTOELECTRONICS TECHNOLOGY CO., LTD., Shenzhen, Guangdong (CN)

(72) Inventor: Yanfeng Fu, Shenzhen (CN)

(73) Assignee: Shenzhen China Star Optoelectronics Technology, Co., Ltd., Shenzhen, Guangdong (CN)

( * ) Notice: Subject to any disclaimer, the term of this patent is extended or adjusted under 35 U.S.C. 154(b) by 327 days.

(21) Appl. No.: 14/383,035

(22) PCT Filed: Jul. 11, 2014

(86) PCT No.: PCT/CN2014/082101
§ 371 (c)(1),
(2) Date: Sep. 4, 2014

(87) PCT Pub. No.: WO2015/176367
PCT Pub. Date: Nov. 26, 2015

(65) Prior Publication Data
US 2016/0252756 A1    Sep. 1, 2016

(30) Foreign Application Priority Data
May 21, 2014    (CN) .......................... 2014 1 0216387

(51) Int. Cl.
*G01R 31/26* (2014.01)
*G02F 1/13* (2006.01)
(Continued)

(52) U.S. Cl.
CPC .......... *G02F 1/1309* (2013.01); *G02F 1/1362* (2013.01); *G01R 19/16519* (2013.01);
(Continued)

(58) Field of Classification Search
CPC .. G09G 2330/12; G09G 3/006; G09G 3/3233; G09G 3/324; G09G 3/325;
(Continued)

(56) References Cited

U.S. PATENT DOCUMENTS 5,546,013 A * 8/1996 Ichioka .................. G09G 3/006
324/760.02
5,805,246 A * 9/1998 Lee .................... G02F 1/136204
349/150
(Continued)

FOREIGN PATENT DOCUMENTS

CN     101320169 A    6/2008
CN     101604103 A    12/2009
(Continued)

OTHER PUBLICATIONS

Chinese Office Action with search report dated Mar. 8, 2016, issued by the Chinse Patent Office in corresponding application 201410216387.4.
(Continued)

*Primary Examiner* — Jermele M Hollington
*Assistant Examiner* — Sean Curtis
(74) *Attorney, Agent, or Firm* — Kim Winston LLP

(57) ABSTRACT

The present disclosure relates to a peripheral test circuit of a display array substrate, and a liquid crystal display panel. The peripheral test circuit of a display array substrate includes: multiple groups of test signal lines, each group consisting of a first and a second test signal lines spaced from each other; a plurality of test pad leads, each being arranged in an interval formed between the first and the second test signal lines of a respective group, and connected with the first and the second test signal lines but not overlapped with the first and the second test signal lines of other groups; and a plurality of test pads, each being
(Continued)

arranged on a respective test pad lead. According to the peripheral test circuit of the present disclosure, the problem existing in the current peripheral test circuit, i.e., a short circuit formed between the test pad lead and the test signal line due to electrostatic discharge caused by crossover between the test pad lead and the test signal line, can be overcome, thus reducing the injury risk of electrostatic discharge.

9 Claims, 2 Drawing Sheets

(51) Int. Cl.
    *G02F 1/1362*     (2006.01)
    *G01R 19/165*     (2006.01)

(52) U.S. Cl.
    CPC ...... *G01R 31/2621* (2013.01); *G01R 31/2635* (2013.01); *G02F 2001/136254* (2013.01)

(58) Field of Classification Search
    CPC ............ H04N 9/3191; G01R 19/16519; G01R 31/2621; G01R 31/2635
    USPC ........................................ 324/760.01, 760.02
    See application file for complete search history.

(56) References Cited

U.S. PATENT DOCUMENTS

| | | | | |
|---|---|---|---|---|
| 6,150,833 | A * | 11/2000 | Lin | G01R 1/0408 269/110 |
| 6,781,402 | B2 * | 8/2004 | Uh | G09G 3/006 324/760.02 |
| 6,850,088 | B2 * | 2/2005 | Uh | G09G 3/006 324/760.01 |
| 7,110,057 | B2 * | 9/2006 | Jeon | G02F 1/136286 349/139 |
| 7,142,262 | B2 * | 11/2006 | Chen | G02F 1/13452 349/40 |
| 7,145,539 | B2 * | 12/2006 | Lim | G09G 3/006 345/100 |
| 7,365,560 | B2 * | 4/2008 | Uh | G09G 3/006 324/760.01 |
| 7,365,562 | B2 * | 4/2008 | Jeon | G02F 1/13454 324/760.01 |
| 7,411,410 | B2 * | 8/2008 | Kang | G02F 1/1309 324/756.07 |
| 7,580,107 | B2 * | 8/2009 | Moon | G02F 1/1345 349/192 |
| 7,619,436 | B2 * | 11/2009 | Kwak | H01L 22/34 324/760.02 |
| 7,626,670 | B2 * | 12/2009 | Park | G09G 3/006 349/149 |
| 7,692,443 | B2 * | 4/2010 | Jeon | G09G 3/006 324/760.01 |
| 7,755,713 | B2 * | 7/2010 | Lin | G02F 1/13452 324/760.01 |
| 7,843,208 | B2 * | 11/2010 | Kwak | H01L 22/34 324/760.02 |
| 7,894,034 | B2 * | 2/2011 | Park | G09G 3/006 349/149 |
| 7,956,945 | B2 * | 6/2011 | Kim | G02F 1/136204 349/40 |
| 7,986,379 | B2 * | 7/2011 | Lee | G02F 1/136204 349/40 |
| 8,179,493 | B2 * | 5/2012 | Kil | G02F 1/136286 349/49 |
| 8,208,084 | B2 * | 6/2012 | Lin | G02F 1/1345 349/192 |
| 8,305,542 | B2 * | 11/2012 | Kang | G02F 1/1345 349/149 |
| 8,502,766 | B2 * | 8/2013 | Jiang | G09G 3/006 324/527 |
| 8,755,000 | B2 * | 6/2014 | Lin | G02F 1/1345 349/192 |
| 9,000,797 | B2 * | 4/2015 | Wen | G01R 31/2851 324/760.01 |
| 9,046,725 | B2 * | 6/2015 | Agata | G09G 3/006 |
| 9,165,950 | B2 * | 10/2015 | Xu | H01L 22/32 |
| 9,177,497 | B2 * | 11/2015 | Li | G09G 3/006 |
| 9,366,928 | B2 * | 6/2016 | Zhang | G02F 1/1309 |
| 2002/0039089 | A1 * | 4/2002 | Lim | G09G 3/006 345/87 |
| 2003/0169066 | A1 * | 9/2003 | Uh | G09G 3/006 324/760.02 |
| 2004/0095303 | A1 * | 5/2004 | Moon | G09G 3/006 345/87 |
| 2004/0095549 | A1 * | 5/2004 | Moon | G02F 1/1345 349/192 |
| 2004/0124868 | A1 * | 7/2004 | Lim | G02F 1/13452 324/760.01 |
| 2004/0163449 | A1 * | 8/2004 | Uh | G09G 3/006 73/104 |
| 2005/0083444 | A1 * | 4/2005 | Chen | G02F 1/13452 349/40 |
| 2005/0099204 | A1 * | 5/2005 | Uh | G09G 3/006 324/760.01 |
| 2006/0284633 | A1 * | 12/2006 | Park | G09G 3/006 324/760.02 |
| 2007/0013637 | A1 * | 1/2007 | Moon | G09G 3/006 345/98 |
| 2007/0120790 | A1 * | 5/2007 | Jeon | G09G 3/006 345/87 |
| 2007/0170949 | A1 * | 7/2007 | Pak | G09G 3/006 324/760.01 |
| 2007/0252614 | A1 * | 11/2007 | Jeon | G02F 1/13454 324/760.01 |
| 2009/0161056 | A1 * | 6/2009 | Kil | G02F 1/136286 349/149 |
| 2009/0213288 | A1 * | 8/2009 | Chen | G02F 1/1303 349/43 |
| 2009/0273753 | A1 * | 11/2009 | Park | G09G 3/006 349/152 |
| 2009/0296039 | A1 * | 12/2009 | Park | G09G 3/006 349/149 |
| 2009/0310051 | A1 * | 12/2009 | Kim | G02F 1/136204 349/40 |
| 2010/0007369 | A1 * | 1/2010 | Kwak | H01L 22/34 324/760.01 |
| 2010/0238368 | A1 * | 9/2010 | Kim | G02F 1/13458 349/40 |
| 2010/0301891 | A1 * | 12/2010 | Moon | G02F 1/1345 324/760.01 |
| 2011/0096449 | A1 * | 4/2011 | Lee | G02F 1/1345 361/91.1 |
| 2015/0062478 | A1 * | 3/2015 | Zhao | G02F 1/1309 349/54 |
| 2015/0199929 | A1 * | 7/2015 | Kim | G09G 3/006 324/762.01 |
| 2015/0301419 | A1 * | 10/2015 | Fu | G02F 1/136286 257/773 |
| 2015/0311130 | A1 * | 10/2015 | Zhang | G02F 1/1362 257/48 |
| 2015/0325159 | A1 * | 11/2015 | Li | G02F 1/136286 702/117 |
| 2016/0231631 | A1 * | 8/2016 | Fu | G02F 1/1345 |
| 2016/0252756 | A1 * | 9/2016 | Fu | G02F 1/1309 324/760.01 |

FOREIGN PATENT DOCUMENTS

| | | | | |
|---|---|---|---|---|
| CN | | 101604103 A | 12/2009 | |
| CN | | 103353693 A | 6/2013 | |
| CN | | 103713434 A | 9/2013 | |
| CN | | 103728763 A | 12/2013 | |
| CN | WO | 2014015543 A1 * | 1/2014 | ........... G02F 1/1333 |
| CN | | 103713434 A | 4/2014 | |

(56) References Cited

FOREIGN PATENT DOCUMENTS

| CN | 104035217 A | * | 9/2014 | ........... G02F 1/1309 |
| CN | 104464580 A | * | 3/2015 | ............. G09G 3/006 |
| CN | WO 2015027615 A1 | * | 3/2015 | ....... G02F 1/136286 |
| CN | WO 2015100801 A1 | * | 7/2015 | ......... H01L 27/3232 |
| CN | WO 2015176367 A1 | * | 11/2015 | ........... G02F 1/1309 |
| KR | 20150033944 A | * | 4/2015 | ............. G09G 3/006 |

OTHER PUBLICATIONS

International Search Report for PCT/CN2014/082101 dated Feb. 27, 2015.
International Search Report for PCT/CN2014/079610 dated Jul. 29, 2014.

* cited by examiner

PERIPHERAL TEST CIRCUIT OF DISPLAY ARRAY SUBSTRATE AND LIQUID CRYSTAL DISPLAY PANEL

The present disclosure claims the priority of Chinese Patent Application CN 201410216387.4, filed on May 21, 2014 and entitled "Peripheral test circuit of display array substrate and liquid crystal display panel", the entire contents of which are herein incorporated by reference.

FIELD OF THE INVENTION

The present disclosure relates to the field of liquid crystal display, in particular to a peripheral test circuit of a display array substrate and a liquid crystal display panel.

BACKGROUND OF THE INVENTION

Generally, in the previous process of manufacturing a liquid crystal display, millions of thin film transistors are formed on a substrate through an epitaxial method to serve as control units. However, if the quality of part of the thin film transistors cannot achieve the desired effect during manufacturing, the switching control characteristic cannot be presented, so that the defect of bright spots or dark spots will be produced, and thus the quality of the liquid crystal display will be significantly reduced. Therefore, the thin film transistors must be effectively tested to maintain the quality of the liquid crystal display.

In the existing solutions for testing the thin film transistors of the display, for the structure of connecting test signal lines on the peripheral area of a TFT array substrate with test pads, reference may be made to FIG. 1. As shown in FIG. 1, a test signal line M1 on the peripheral area of the substrate passes through a passivation layer via hole V1 through which ITO is connected with the test signal line M1 and a passivation layer via hole V2 through which ITO is connected with a test pad lead M2, and then is connected with the test pad lead M2 and further connected to a corresponding test pad P. It could be seen from the figure that, in the process of connecting different test signal lines M1 to the corresponding test pads P through the test pad leads M2, the test pad leads M2 will have to run across other test signal lines M1. Electrostatic discharge is easily caused in the crossover process of the test signal lines M1 and the test pad leads M2, so that the test signal lines M1 and the test pad leads M2 will be in short circuit with each other. In this case, the test signal lines are short-circuited and no detction can be performed, thus reducing the yield of a product.

Therefore, a solution is needed to solve the problem that the test signal lines and the test pad leads are easily in short circuit with each other in the prior art, reduce the injury risk of electrostatic discharge, improve the test accuracy of the product, and then improve the yield of the product.

SUMMARY OF THE INVENTION

One of the technical problems to be solved by the present disclosure is to provide a peripheral test circuit of a display array substrate, which may solve the problem that test signal lines and test pad leads are easily in short circuit with each other, and may further reduce the injury risk of electrostatic discharge. In addition, the display array substrate and a liquid crystal display panel are further provided.

To solve the above-mentioned technical problem, the present disclosure provides a peripheral test circuit of a display array substrate, including: multiple groups of test signal lines, each group of test signal lines consisting of a first test signal line and a second test signal line spaced from each other; a plurality of test pad leads, each test pad lead being arranged in an interval formed between the first test signal line and the second test signal line of a respective group, and connected with the first test signal line and the second test signal line but not overlapped with the first test signal line and the second test signal line of other groups; and a plurality of test pads, each test pad being arranged on a respective test pad lead.

In an embodiment, each test pad lead is connected with the first test signal line of the group associated with said test pad lead in a non-overlapping manner through a first passivation layer via hole and a second passivation layer via hole, and connected with the second test signal line of the group associated with said test pad lead in a non-overlapping manner through a third passivation layer via hole and a fourth passivation layer via hole. In this arrangement, the first passivation layer via hole is a passivation layer via hole through which an ITO layer is connected with the first test signal line, the second passivation layer via hole is a passivation layer via hole through which the ITO layer is connected with the test pad lead, the third passivation layer via hole is a passivation layer via hole through which another ITO layer is connected with the second test signal line, and the fourth passivation layer via hole is a passivation layer via hole through which said another ITO layer is connected with the test pad lead.

In an embodiment, the plurality of test pad leads are arranged in parallel but staggered from each other.

In an embodiment, the first test signal line and the second test signal line of each group are respectively connected with a corresponding test pad lead along a direction perpendicular thereto.

According to another aspect of the present disclosure, further provided is a display array substrate, including a display area and a peripheral test circuit located around the display area. The peripheral test circuit includes: multiple groups of test signal lines, each group of test signal lines consisting of a first test signal line and a second test signal line spaced from each other; a plurality of test pad leads, each test pad lead being arranged in an interval formed between the first test signal line and the second test signal line of a respective group, and connected with the first test signal line and the second test signal line but not overlapped with the first test signal line and the second test signal line of other groups; and a plurality of test pads, each test pad being arranged on a respective test pad lead.

In an embodiment, each test pad lead is connected with the first test signal line of the group associated with said test pad lead in a non-overlapping manner through a first passivation layer via hole and a second passivation layer via hole, and connected with the second test signal line of the group associated with said test pad lead in a non-overlapping manner through a third passivation layer via hole and a fourth passivation layer via hole. In this arrangement, the first passivation layer via hole is a passivation layer via hole through which an ITO layer is connected with the first test signal line, the second passivation layer via hole is a passivation layer via hole through which the ITO layer is connected with the test pad lead, the third passivation layer via hole is a passivation layer via hole through which another ITO layer is connected with the second test signal line, and the fourth passivation layer via hole is a passivation layer via hole through which said another ITO layer is connected with the test pad lead.

In an embodiment, a plurality of test pad leads are arranged in parallel but staggered from each other.

In an embodiment, the first test signal line and the second test signal line of each group are respectively connected with a corresponding test pad lead along a direction perpendicular thereto.

According to a further aspect, also provided is a liquid crystal display panel including the above-mentioned display array substrate.

Compared with the prior art, one or more embodiments of the present disclosure may have the following advantages. According to the peripheral test circuit of the present disclosure, a crossover phenomenon between the test pad leads and the test signal lines can be avoided by changing the mode of connection between the test signal lines and the test pads. The test pad leads will not cross over the test signal lines through the via holes at the connection positions of the test pad leads and the test signal lines, so that the injury risk of electrostatic discharge is reduced, the test accuracy of a product is improved, and the yield of the product is improved.

Other features and advantages of the present disclosure will be set forth in the following description, and in part will be made obvious from the description, or be learned by implementing the present disclosure. The objectives and other advantages of the present disclosure may be achieved and obtained by structures particularly pointed out in the description, the claims and the accompanying drawings.

BRIEF DESCRIPTION OF THE DRAWINGS

The accompanying drawings are configured to provide a further understanding of the present disclosure, constitute a part of the description, and explain the present disclosure together with the embodiments of the present disclosure without limiting the present disclosure. In the accompanying drawings.

DETAILED DESCRIPTION OF THE EMBODIMENTS

In order that the objectives, technical solutions and advantages of the present disclosure are clearer, a further detailed illustration to the present disclosure will be given below, in combination with the accompanying drawings.

Figure 1:
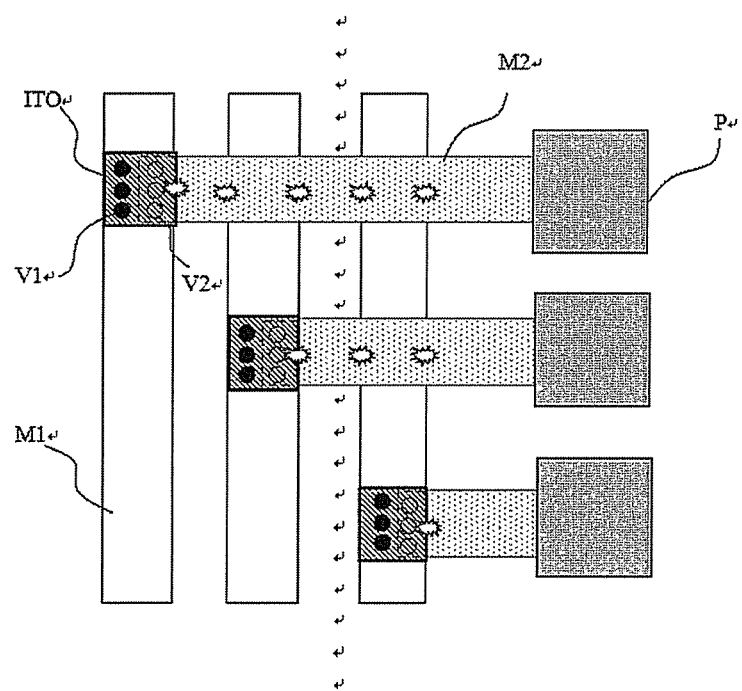
FIG. 1 is a schematic diagram of a structure of connecting test signal lines on the peripheral area of a TFT array substrate with test pads in the prior art.
Figure 2:
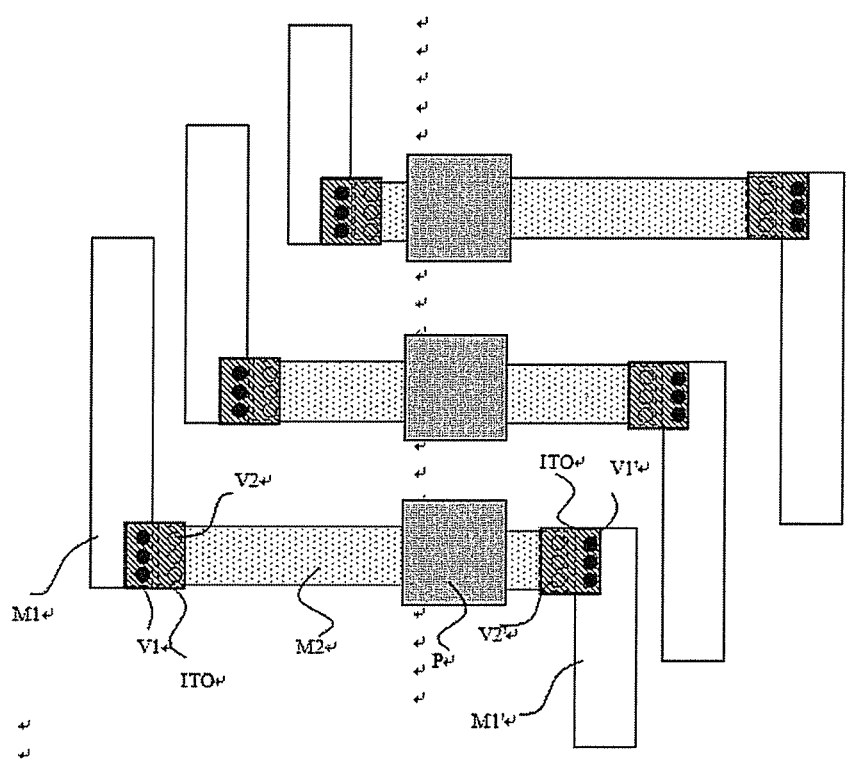
FIG. 2 is a schematic, diagram of a peripheral test circuit of a display array substrate according to an embodiment of the present disclosure.

FIG. 2 is a schematic diagram of a peripheral test circuit of a display array substrate according to an embodiment of the present disclosure.

As shown in FIG. 2, the peripheral test circuit includes: multiple groups of test signal lines, each group of test signal lines consisting of a first test signal line M1 and a second test signal line M1' spaced from each other; a plurality of test pad leads M2, each test pad M2 lead being arranged in an interval formed between the first test signal line M1 and the second test signal line M1' of a respective group, and connected with said first test signal line M1 and said second test signal line M1' but not overlapped with the first test signal line M1 and the second test signal line M1' of other groups; and a plurality of test pads P, each test pad P being arranged on a respective test pad lead M2. The test pads P may transmit test signals generated by a signal generator to corresponding data lines or scan lines through the test signal lines M1 and M1', in order to detect whether the data lines or the scan lines are open-circuit.

In an embodiment, one end of each test pad lead M2 is connected with the first test signal line M1 of the same group as said test pad lead M2 in a non-overlapping manner through a first passivation layer via hole V1 and a second passivation layer via hole V2, and the other end of each test pad lead M2 is connected with the second test signal line M1' of the same group as said test pad lead M2 in a non-overlapping manner through a third passivation layer via hole V1' and a fourth passivation layer via hole V2'. In this arrangement, the first passivation layer via hole V1 is a passivation layer via hole through which an ITO layer is connected with the first test signal line M1, the second passivation layer via hole V2 is a passivation layer via hole through which the ITO layer is connected with one end of the test pad lead M2, the third passivation layer via hole V1' is a passivation layer via hole through which another ITO layer is connected with the second test signal line M1', and the fourth passivation layer via hole V2' is a passivation layer via hole through which the another ITO layer is connected with the other end the test pad lead M2. Preferably, the plurality of test pad leads M2 are arranged in parallel, but staggered with each other, and the first test signal line M1 and the second test signal line M1' of each group are respectively connected with a corresponding test pad lead M2 along a direction perpendicular thereto, in particular as shown in FIG. 2.

The peripheral test circuit according to the embodiment of the present disclosure solves the problem that the test pad leads are in short circuit with the test signal lines due to high electrostatic discharge possibility caused by overlapping crossover of the test pad leads and the test signal lines in the existing peripheral test circuit. The injury risk of electrostatic discharge may be reduced. Therefore, the test accuracy of a product may be improved, and the yield of the product may be improved.

The present disclosure further provides a display array substrate, including a display area and a peripheral test circuit located around the display area, wherein the peripheral test circuit is one with the above structure. In addition, the present disclosure further provides a liquid crystal display panel, including the above-mentioned display array substrate.

The foregoing descriptions are merely specific embodiments of the present disclosure, rather than limiting the protection scope of the present disclosure. Variations or substitutions made to the present disclosure by any skilled one familiar with this art within the technical specification of the present disclosure shall fall into the protection scope of the present disclosure.

The invention claimed is:

1. A peripheral test circuit of a display array substrate, including:
   multiple groups of test signal lines, each group of test signal lines consisting of a first test signal line and a second test signal line spaced from each other;
   a plurality of test pad leads, each test pad lead being arranged in an interval formed between the first test signal line and the second test signal line of a respective group, and connected with the first test signal line and the second test signal line but not overlapped with the first test signal line and the second test signal line of other groups; and
   a plurality of test pads, each test pad being arranged on a respective test pad lead, wherein each test pad lead is connected with the first test signal line of the group associated with the test pad lead in a non-overlapping manner through a first passivation layer via hole and a second passivation layer via hole, and is connected with the second test signal line of the group associated with the test pad lead in a non-overlapping manner through a third passivation layer via hole and a fourth passivation layer via hole, and wherein the first passivation layer via hole is a passivation layer via hole through which an ITO layer is connected with the first test signal line, the second passivation layer via hole is a passivation layer via hole through which the ITO layer is connected with the test pad lead, the third passivation layer via hole is a passivation layer via hole through which another ITO layer is connected with the second test signal line, and the fourth passivation layer via hole is a passivation layer via hole through which said another ITO layer is connected with the test pad lead.

2. The peripheral test circuit according to claim 1, wherein the plurality of test pad leads are arranged in parallel but staggered from each other.

3. The peripheral test circuit according to claim 2, wherein the first test signal line and the second test signal line of each group are respectively connected with a corresponding test pad lead along a direction perpendicular thereto.

4. A display array substrate, including a display area and a peripheral test circuit arranged around the display area, said peripheral test circuit including:

multiple groups of a display array substrate test signal lines, each group of test signal lines consisting of a first test signal line and a second test signal line spaced from each other;

a plurality of test pad leads, each test pad lead being arranged in an interval formed between the first test signal line and the second test signal line of a respective group, and connected with the first test signal line and the second test signal line but not overlapped with the first test signal line and the second test signal line of other groups; and a plurality of test pads, each test pad being arranged on a respective test pad lead, wherein each test pad lead is connected with the first test signal line of the group associated with the test pad lead in a non-overlapping manner through a first passivation layer via hole and a second passivation layer via hole, and is connected with the second test signal line of the group associated with the test pad lead in a non-overlapping manner through a third passivation layer via hole and a fourth passivation layer via hole, and wherein the first passivation layer via hole is a passivation layer via hole through which an ITO layer is connected with the first test signal line, the second passivation layer via hole is a passivation layer via hole through which the ITO layer is connected with the test pad lead, the third passivation layer via hole is a passivation layer via hole through which another ITO layer is connected with the second test signal line, and the fourth passivation layer via hole is a passivation layer via hole through which said another ITO layer is connected with the test pad lead.

5. The display array substrate according to claim 4, wherein the plurality of test pad leads are arranged in parallel but staggered from each other.

6. The display array substrate according to claim 5, wherein the first test signal line and the second test signal line of each group are respectively connected with a corresponding test pad lead along a direction perpendicular thereto.

7. A liquid crystal display panel, having a display array substrate including a display area and a peripheral test circuit arranged around the display area, said peripheral test circuit including:

multiple groups of test signal lines, each group of test signal lines consisting of a first test signal line and a second test signal line spaced from each other;

a plurality of test pad leads, each test pad lead being arranged in an interval formed between the first test signal line and the second test signal line of a respective group, and connected with the first test signal line and the second test signal line but not overlapped with the first test signal line and the second test signal line of other groups; and a plurality of test pads, each test pad being arranged on a respective test pad lead, wherein each test pad lead is connected with the first test signal line of the group associated with the test pad lead in a non-overlapping manner through a first passivation layer via hole and a second passivation layer via hole, and is connected with the second test signal line of the group associated with the test pad lead in a non-overlapping manner through a third passivation layer via hole and a fourth passivation layer via hole, and wherein the first passivation layer via hole is a passivation layer via hole through which an ITO layer is connected with the first test signal line, the second passivation layer via hole is a passivation layer via hole through which the ITO layer is connected with the test pad lead, the third passivation layer via hole is a passivation layer via hole through which another ITO layer is connected with the second test signal line, and the fourth passivation layer via hole is a passivation layer via hole through which said another ITO layer is connected with the test pad lead.

8. The liquid crystal display panel according to claim 7, wherein the plurality of test pad leads are arranged in parallel but staggered from each other.

9. The liquid crystal display panel according to claim 8, wherein the first test signal line and the second test signal line of each group are respectively connected with a corresponding test pad lead along a direction perpendicular thereto.

* * * * *